United States Patent
Lai

(10) Patent No.: US 10,020,299 B2
(45) Date of Patent: Jul. 10, 2018

(54) ELECTROSTATIC DISCHARGE PROTECTION USING A GUARD REGION

(71) Applicant: NXP B.V., Eindhoven (NL)

(72) Inventor: Da-Wei Lai, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/080,154

(22) Filed: Mar. 24, 2016

(65) Prior Publication Data

US 2017/0278839 A1 Sep. 28, 2017

(51) Int. Cl.
| | |
|---|---|
| H03K 5/08 | (2006.01) |
| H01L 27/02 | (2006.01) |
| H01L 29/06 | (2006.01) |
| H03K 17/081 | (2006.01) |
| H01L 29/74 | (2006.01) |

(52) U.S. Cl.
CPC ...... *H01L 27/0262* (2013.01); *H01L 27/0255* (2013.01); *H01L 29/0619* (2013.01); *H01L 29/7436* (2013.01); *H03K 17/08108* (2013.01)

(58) Field of Classification Search
CPC ............. H01L 27/0266; H01L 27/0251; H01L 27/0255; H01L 27/0262; H02H 9/046
USPC ..................................... 327/309–313; 361/56
See application file for complete search history.

(56) References Cited

U.S. PATENT DOCUMENTS

| | | | | |
|---|---|---|---|---|
| 5,563,438 A * | 10/1996 | Tsang | ................... | H01L 27/0921 257/355 |
| 5,663,860 A * | 9/1997 | Swonger | ............. | H01L 27/0262 257/173 |
| 6,323,523 B1 * | 11/2001 | Lee | ...................... | H01L 27/0262 257/355 |
| 7,633,096 B2 * | 12/2009 | Song | ................... | H01L 27/0262 257/173 |
| 2009/0267154 A1 * | 10/2009 | Boselli | ................ | H01L 27/0259 257/355 |
| 2013/0222952 A1 * | 8/2013 | Lai | ......................... | H02H 9/046 361/56 |

OTHER PUBLICATIONS

Feng, H., et al. "RC-SCR: a novel low-voltage ESD protection circuit with new triggering mechanism." Circuits and Systems, 2002. APCCAS'02. 2002 Asia-Pacific Conference on. vol. 2. IEEE, 2002.

Tan, Pee-Ya, et al. "RC-triggered PNP and NPN simultaneously switched silicon controlled rectifier ESD networks for sub-0.18μm technology." Physical and Failure Analysis of Integrated Circuits, 2005. IPFA 2005. Proceedings of the 12th International Symposium on the. IEEE, 2005.

(Continued)

*Primary Examiner* — Quan Tra

(57) ABSTRACT

A silicon controlled rectifier (SCR) circuit is configured to shunt electrostatic discharge (ESD) current from a node to a reference voltage. The SCR circuit includes a first bipolar PNP transistor having a first emitter connected to the node, a first base, and a first collector. A second bipolar NPN transistor has a second collector sharing a first region with the first base, a second base sharing a second region with the first collector, and an emitter electrically connected to the reference voltage. A guard region is configured and arranged to delay triggering of the SCR circuit in response to an ESD event by impeding current flow in the second region.

19 Claims, 10 Drawing Sheets

(56) References Cited

OTHER PUBLICATIONS

Li, Junjun, James Di Sarro, and Robert Gauthier. "Design and optimization of SCR devices for on-chip ESD protection in advanced SOI CMOS technologies." Electrical Overstress/Electrostatic Discharge Symposium Proceedings 2012. 2012.

* cited by examiner

US 10,020,299 B2

ELECTROSTATIC DISCHARGE PROTECTION USING A GUARD REGION

OVERVIEW

Aspects of various embodiments are directed to an electrostatic discharge (ESD) protection from a circuit with guard region that effects current flow and operating characteristics of the circuit.

ESD is the sudden flow of electricity that can be caused by a buildup of static electricity between two nodes that come into electrical contact. An ESD event can occur when the objects are close enough for the dielectric between them to break down. ESD events are the cause of many failures for integrated circuit (IC) devices and chips. ESD protection can be provided using a variety of different circuit solutions. The operating characteristics for ESD protection can be limited by the IC chip space, manufacturing process and costs, and technology limitations.

These and other matters have presented challenges to efficiencies of ESD protection implementations, for a variety of applications.

SUMMARY

Various example embodiments are directed toward a silicon controlled rectifier (SCR) circuit that uses an active guard-ring in between two bipolar transistors that provide an SCR path (e.g., PNPN). This can be useful for achieving an increased snapback holding voltage during an ESD event. Particular aspects allow for the functionality during normal operation to remain largely unaffected.

Certain embodiments of the present disclosure are directed toward a silicon controlled rectifier (SCR) circuit is configured to shunt electrostatic discharge (ESD) current from a node to a reference voltage. The SCR circuit includes a first bipolar PNP transistor having a first emitter connected to the node, a first base, and a first collector. A second bipolar NPN transistor has a second collector that shares a first region with the first base, a second base that shares a second region with the first collector, and an emitter that is electrically connected to the reference voltage. A guard region is configured and arranged to delay triggering of the SCR circuit in response to an ESD event by impeding current flow in the second region.

Various embodiments of the present disclosure are directed toward a method for providing electrostatic discharge (ESD) protection using a silicon controlled rectifier (SCR) circuit. The method includes charging, in response to an ESD event, a resistor-capacitor (RC) trigger circuit. In response to charge on the RC trigger circuit, a first bipolar transistor in the SCR circuit is enabled. The enabling of a second bipolar transistor of the SCR circuit is delayed by impeding current in a base of the second bipolar transistor using a guard region. Subsequent to the delaying, ESD current is shunted through the first and second bipolar transistors of the SCR circuit.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
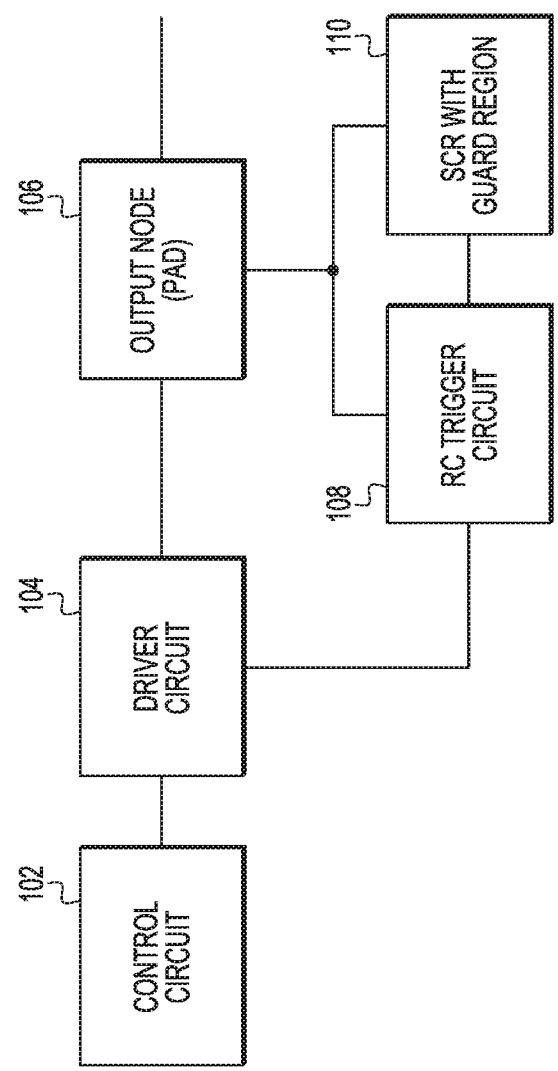
FIG. 1 is a block diagram of a system that includes ESD protection circuitry, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving ESD protection for circuit components. In certain implementations, aspects of the present disclosure have been shown to be beneficial when used in the context of integrated circuit (IC) chips manufactured using complementary-metal-oxide semiconductor (CMOS) compatible processes. In some embodiments, the holding voltage of the ESD protection circuit is controlled using a guard region. These and other aspects can be implemented to address challenges, including those discussed in the background above. While not necessarily so limited, various aspects may be appreciated through a discussion of examples using such exemplary contexts.

In the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures or embodiments, it will be appreciated that features from one figure can be combined with features of another figure or embodiment even though the combination is not explicitly shown or explicitly described as a combination.

According to various embodiments of the present disclosure, a silicon controlled rectifier (SCR) circuit can be designed to provide ESD protection. Particular aspects relate to an SCR circuit that includes a guard region (or guard ring) that is configured to increase the snapback holding voltage for the ESD protection. SCR circuits can provide low on resistance while using a small amount of physical space on an IC chip. SCR circuits tend to have a low snapback holding voltage (or just 'holding voltage'), which can lead to latch-up conditions for high voltage devices. SCR circuits can also have a high trigger voltage, which can lead to damage to the circuit under ESD protection.

Various embodiments of the present disclosure are directed toward an ESD protection circuit that uses a resistive-capacitive (RC) trigger circuit to effectively reduce the trigger voltage. In combination with the RC trigger circuit, a guard region impedes current flow within the SCR in a manner that increases the effective holding voltage. The resulting ESD protection circuit can provide both a relatively low trigger voltage and a relatively high holding voltage. Various aspects are directed toward use of a guard region with a minimal impact on the size of the SCR portion of the ESD protection circuit.

In various embodiments, a silicon controlled rectifier (SCR) circuit is configured to shunt electrostatic discharge (ESD) current from a node to a reference voltage. The SCR circuit is made from two bipolar transistors that share regions of their respective transistor components. Each of the bipolar transistors includes a respective first emitter, base and collector. The bipolar transistors are of opposite type (PNP vs NPN) and share two overlapping doped P/N regions. For instance, the SCR structure can be PNPN with the middle "NP" regions shared between the bipolar transistors.

Particular embodiments are directed toward a configuration in which the emitter of a PNP bipolar transistor is connected to the node being protected from ESD events. The other bipolar transistor is an NPN transistor with a collector and base that share regions with the PNP base and PNP collector, respectively. The emitter of the NPN transistor can be connected to a reference voltage. Consistent with various embodiments, the reference voltage is provided by connecting to a power supply terminal to which ESD current can be safely discharged. For example, the reference voltage can be the negative voltage supply of field-effect transistors (FETs) that are being protected from ESD events. The negative supply voltage is sometimes also referred to as ground. Thus, the SCR shunts ESD current between the node and the reference voltage when activated by an ESD event. A guard region (or ring) is configured and arranged to delay triggering of the SCR circuit in response to an ESD event by impeding current flow region corresponding to the base of the NPN transistor. For example, the guard region can be implemented using an N-well that is connected to a reference node. The voltage on the reference node impedes the current through the second region and thereby increases the holding voltage of the SCR circuit, relative to a similar SCR circuit without the guard region.

As discussed herein and consistent with certain embodiments, the holding voltage (VH) and similar parameters can be determined using transmission line pulse (TLP) measurements. A TLP measurement can be taken by pre-charging a transmission line to a high-voltage and then rapidly discharging the energy to the ESD protection device being tested. Unless otherwise stated, relative comparisons of parameters for different devices (e.g., snapback holding voltage or otherwise) are made using a similar TLP measurement process for each of the compared devices.

According to various embodiments, the bipolar transistors can be created in connection with complementary metal-oxide semiconductor (CMOS) manufacturing processes and structures, where the bipolar transistors are formed from components that alternate doping types (NPN or PNP) within the CMOS-based structures.

Turning now to the figures, FIG. 1 is a block diagram of a system that includes ESD protection circuitry, consistent with embodiments of the present disclosure. Driver circuit 104 can be configured to drive an output signal on the output node 106 in response to control signals provided from the control circuit 102. The particular function of the control circuit 102 and configuration of the driver circuit 104 can vary between implementations. In certain embodiments, the driver circuit 104 is susceptible to damage from ESD events. In more particular embodiments, the driver circuit 104 has a low failure threshold voltage and a relatively high operational voltage. The low failure threshold can define the range of satisfactory the trigger voltages, while the operational voltage can define the satisfactory snapback holding voltage (e.g., avoiding a latch-up condition).

ESD protection for the driver circuit can be provided using ESD protection circuitry that includes an RC trigger circuit 108 and an SCR 110. As discussed herein, the RC trigger circuit 108 can be configured to provide a relatively low trigger voltage for the ESD protection circuitry. In particular embodiments, the RC trigger circuit 108 includes an RC circuit that is responsive to an ESD voltage that is applied to output node 106. The RC trigger circuit 108 can also include logic circuitry that is configured to drive the SCR in response to a voltage of the RC circuit. The logic circuitry can include, for example, CMOS transistors configured as one or more inverters, a combination of digital logic gates, or logic circuitry with similar functionality that is connected between the RC circuit and the first and second bipolar transistors. The RC trigger circuit 108 can be particularly useful for providing a low trigger voltage while not adversely affecting the normal operation of the driver circuit 104.

Various embodiments are directed toward the use of the ESD protection circuitry with various other circuits and configurations of circuits. For example, the node under protection could be connected to various types of circuitry that is to be protected from ESD events, whether the protected circuitry is considered a driver circuitry or otherwise.

Figure 2:
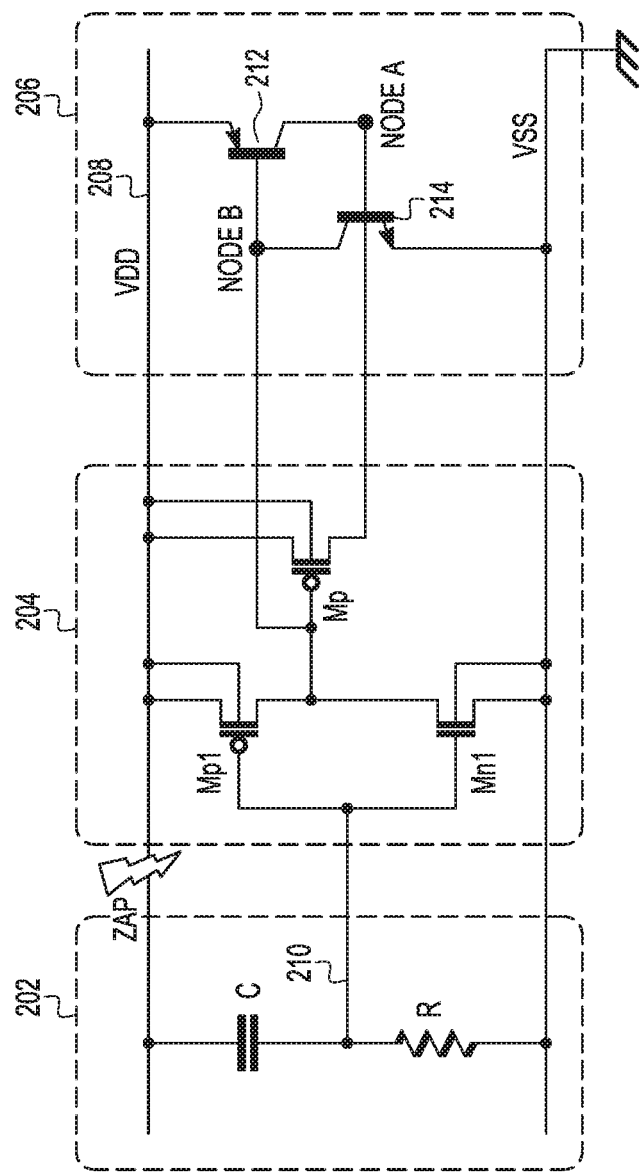
FIG. 2 is a circuit diagram showing an equivalent circuit for ESD protection circuitry, consistent with embodiments of the present disclosure.

FIG. 2 is a circuit diagram showing an equivalent circuit for ESD protection circuitry, consistent with embodiments of the present disclosure. Consistent with the discussion of FIG. 1, an RC trigger circuit can include both an RC circuit 202 and logic circuitry 204. The circuit diagram shows an RC circuit 202 that includes a capacitor (C) and resistor (R) in a series connection between node 208 (which can be tied to a positive reference voltage (VDD)) and a node tied to a reference voltage (e.g., a negative reference voltage ($V_{SS}$)). For ease of discussion, VDD and VSS are used in the following discussion. The RC circuit 202 is configured to quickly develop a voltage across the resistor during an ESD event that is relative to node 204. According to particular embodiments of the present disclosure, the resistive and capacitive portions of the RC circuit 202 can be created using CMOS transistors. For example, the resistor can be created using a CMOS transistor with a relatively long channel, while the capacitor can be created using the gate capacitance of another CMOS transistor.

In response to a voltage developing across the resistor, the logic circuitry 204 enables the SCR circuit 206. The resistor reaches a steady state condition with little or no current during normal operation (in the absence of ESD level voltage swings). This keeps the logic circuitry 204 from enabling the SCR circuit 206 during normal operation.

The logic circuitry 204 that is depicted in FIG. 2 includes an inverter circuit that includes CMOS FETs Mp1 and Mn1. Other logic circuitry is possible, including variations of logic gates providing similar functionality. During normal operation, the voltage at node 210 is at or near $V_{SS}$. In this situation, neither Mp1 is enabled, which bring the voltage a node B high, to Vdd. It is noted that node B is tied to the gate of FET Mp and to the SCR circuit 206. In particular, node B is tied to both the gate of the bipolar transistor 212 and the collector of bipolar transistor 214. In this manner, node B corresponds to the shared N region of the PNPN SCR circuit 206. FET Mp is therefore not enabled during normal operation. Thus, node A is not actively driven by the logic circuitry 204, during normal operation. Node A is tied to both the collector of the bipolar transistor 212 and the gate of the bipolar transistor 214. Accordingly, node A corresponds to the shared P region of the PNPN SCR circuit 206.

When an ESD event occurs on node 208 (between VDD to VSS), a voltage develops across the resistor. The gate node 210 will increase towards VDD, which will cause the inverter formed by Mp1 and Mn1 to drive node B low. In particular, Mn1 is enabled to drive node B to VSS. This results in FET Mp being enabled, which drives node A high, toward VDD. The relative driving of nodes A and B results in a dual trigger signal that is (near) simultaneous at each of the bipolar transistors 212 and 214. The use of such a dual trigger for the SCR can be useful for controlling the turn on characteristics for the SCR.

According to certain embodiments, the logic circuitry 204 can be modified to adjust the trigger signals provided to the bipolar transistors 212 and 214. As a non-limiting example, additional inverter stages can be used to increase the gain of the logic circuitry 204. This can be particularly useful for generating a square wave for the trigger signal, which can result in a faster trigger.

Once the SCR circuit 206 has been enabled, it will shunt current between VDD and VSS. According to various embodiments of the present disclosure, the SCR circuit 206 can include a guard region (e.g., a guard ring) that impedes the current flow within the SCR circuit 206. For instance, the guard region can be located within the SCR region that is directly connected to node A and that corresponds to the base of bipolar transistor 214 and the collector of bipolar transistor 212. The guard region can be configured to impede the flow of current within the corresponding SCR region. More particularly, the SCR region can be a P-well that is within a P-substrate and that helps to form the base of bipolar transistor 214 and the collector of bipolar transistor 212. The guard region can be a N-well that is directly connected to node A such that the N-well voltage is set to the same voltage as node A. This can force at least some of current in the SCR region to flow through the P-substrate and thereby lower the effective snapback holding voltage.

Figure 3:
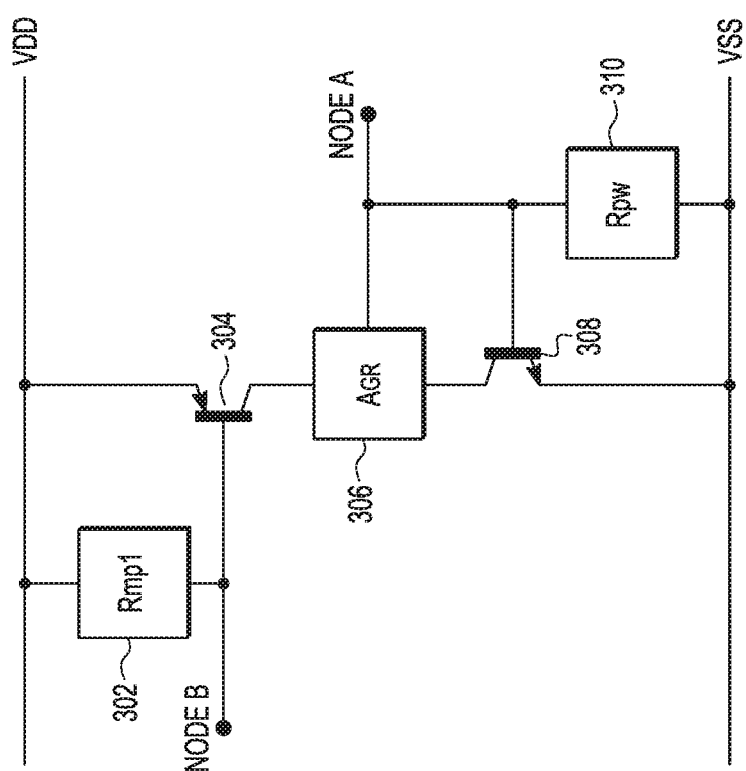
FIG. 3 is a circuit diagram showing an equivalent circuit equivalent of ESD protection circuitry in normal operation, consistent with embodiments of the present disclosure.

FIG. 3 is a circuit diagram showing an equivalent circuit equivalent of ESD protection circuitry in normal operation, consistent with embodiments of the present disclosure. The circuit of FIG. 3 is consistent with the logic circuitry 204, from FIG. 2, when the SCR circuit 206 is not enabled and the ESD protection circuitry is in normal operation mode. Block 302 represents the on-resistance of FET Mp1, which is enabled and pulls node B to VDD. In various embodiments, the on-resistance is low enough to ensure that voltage drop across block 302 is sufficiently low to prevents the bipolar PNP transistor 304 from being enabled.

Embodiments of the present disclosure are directed toward an SCR circuit that includes an embedded diode. The embedded diode can be connected between node A and VSS. The PN junction can be formed between an N contact region and the P-well corresponding to the base of bipolar transistor 308. During normal operation, the diode functions as a resistor that is represented by block 310. The effective resistance of block 310 can be designed to keep the bipolar transistor 308 disabled during normal operation. This can be considered in relation to the P-well characteristics as the effective resistance of block 310 is predominantly determined by the P-well resistance.

Block 305 represents an active guard region (AGR) 306. Consistent with certain embodiments discussed herein, AGR 306 can be located in a region shared between the collector of bipolar transistor 304 and the base of bipolar transistor 308. AGR 306 can be configured to impede current that flow from the bipolar transistor 304 to the collector of bipolar transistor 308. For instance, the AGR 306 can be an N-well that is located within the P-well that corresponds to the base of bipolar transistor 308.

Figure 4:
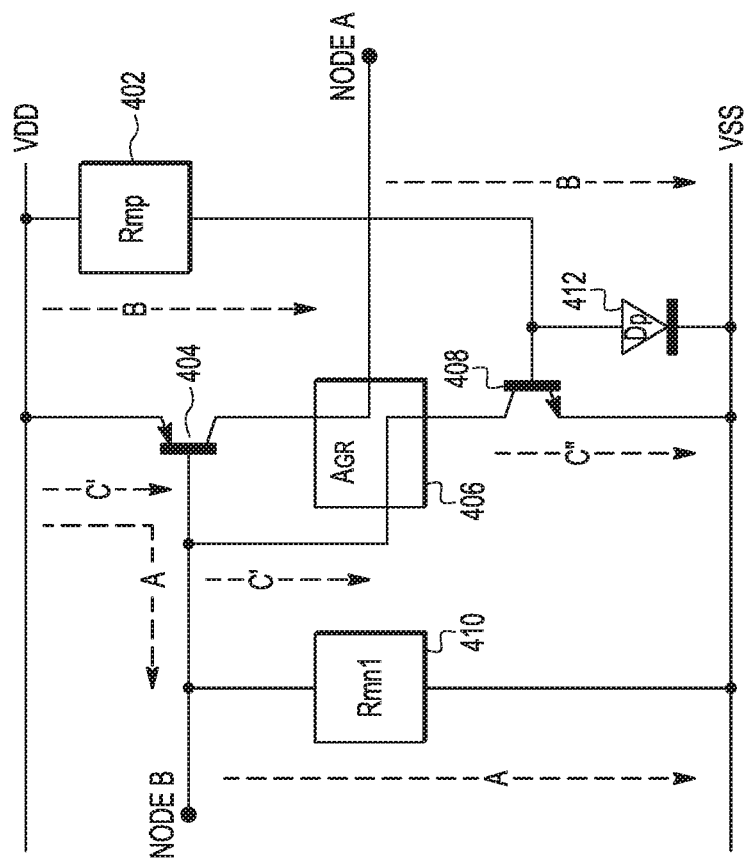
FIG. 4 is a circuit diagram showing an equivalent circuit equivalent of ESD protection circuitry in an ESD event, consistent with embodiments of the present disclosure.

FIG. 4 is a circuit diagram showing an equivalent circuit equivalent of ESD protection circuitry in an ESD event, consistent with embodiments of the present disclosure. The circuit of FIG. 4 is consistent with the logic circuitry 204, from FIG. 2, when the SCR circuit 206 is enabled and the ESD protection circuitry exits normal operation mode. When an ESD voltage is first applied to the VDD node, the RC portion of the RC trigger circuit causes the logic circuitry to enable the SCR circuit by driving node B low (VSS) and node A high (VDD). The presence of AGR 406 delays the turn on of the SCR circuit by inhibiting current that results in the turn on of bipolar transistor 408. During this delay time, ESD current can flow through current paths A and B. Path A includes the diode between the emitter and base of bipolar transistor 404, which becomes forward biased after the FET Mn1 is enabled (conductive) and begins to pull down node B. Block 410 represents the on-resistance of FET Mn1, and provides the remaining portion of the current path A to VSS.

Path B includes the enabled FET Mp, with block 402 representing the on-resistance of FET Mp. The AGR 406 delays the turn on of the bipolar transistor 408, various embodiments are directed toward an SCR circuit that includes an embedded diode 412 within the P-well that forms the base of the bipolar transistor 408. The embedded diode 412 can include an N-portion that is within the P-well and located outside of AGR 406, such that current through the corresponding PN junction of the embedded diode 412 is not impeded by AGR 406. The N-portion can be connected, through a wiring layer, to node A. Due to the delay provided by the AGR 406, current path B can begin conducting before the SCR circuit is fully enabled, particularly with regards to bipolar transistor 408 and the portion of current path C identified as C". The current through current path B can also include at least some current from the upper portion of current path C, which is identified as C'. Similar to the discussion of block 310 of FIG. 3, the effective resistance of the diode 412 can be predominantly defined by the resistance of the P-well.

Once the SCR circuit (including bipolar transistor 408) is fully enabled, the main shunt path for the ESD current is through current path C. It is noted that each of current paths A and B can continue to shunt a portion of the ESD current after the SCR circuit is enabled. The presence of multiple, parallel paths, can increase current capacity of the SCR circuit and can be particularly useful for providing a high secondary breakdown current or the device failure point ($I_{t2}$) and a low on-resistance. According to embodiments of the present disclosure, the combination of AGR 406 and more than one ESD shunting path (by embedded diodes) can delay SCR operation and result in a higher snapback holding voltage.

Figure 5:
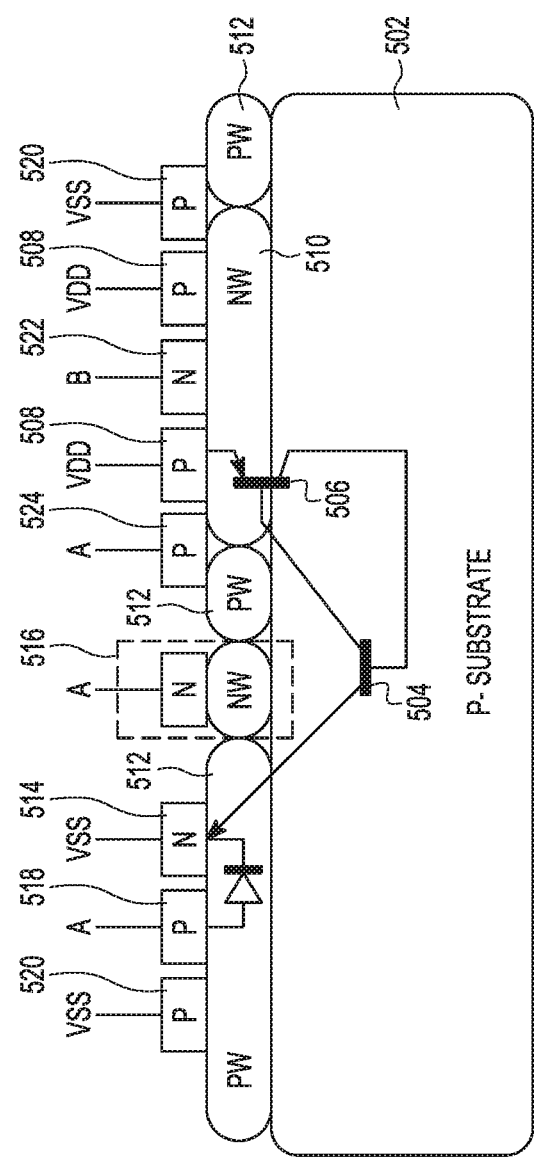
FIG. 5 is a cross-section view of an apparatus that includes an SCR circuit for providing ESD protection, consistent with embodiments of the present disclosure.

FIG. 5 is a cross-section of an apparatus that includes an SCR circuit for providing ESD protection, consistent with embodiments of the present disclosure. The SCR circuit shown in FIG. 5 is generally consistent with the various embodiments discussed herein, including the circuit diagrams and flow diagrams of the other figures. Consistent with particular embodiments, the SCR circuit can be formed on an integrated circuit (IC) chip that includes a P-substrate 502. The SCR circuit includes both vertical bipolar transistor 506 and horizontal bipolar transistor 504, each of which share two regions of a PNPN structure. For instance, vertical bipolar transistor 506 includes an emitter with a corresponding region 508, which can be formed by one or more P-doped fingers that are electrically connected to VDD through a wiring layer. The fingers can be located within an N-well 510. The N-well region 510 can serve as both the base of vertical bipolar transistor 506 and the collector of horizontal bipolar transistor 504. The collector of the vertical bipolar transistor 506 can be formed within a region that includes the P-well 512 and P-substrate 502. This region can also can serve as the base of the horizontal bipolar transistor 504. Horizontal bipolar transistor 504 also includes an emitter with a corresponding region 514. Region 514 can be formed by one or more N-doped fingers that are electrically connected to VSS through an interconnection/wiring layer. FIG. 5 also depicts N-doped finger 522, which forms a contact for biasing the N-well region 510 according to node B, which can be driven by the RC trigger circuitry. Similarly, P-doped region 524 serves as a contact that can provide biasing for node A.

According to various embodiments of the present disclosure, an active guard region 516 can be included within the region corresponding to the collector of the vertical bipolar transistor 506 in a manner that impedes current flow through the region corresponding to the collector. In particular, the active guard region 516 forms a PN junction with the region corresponding to the collector. The active guard region 516 is tied the same potential as node A. The resulting junction creates a depletion region that impedes current flowing from the N-well 510 to the N-doped fingers 514. Consistent with particular embodiments of the present disclosure, the SCR circuit can include a pickup ring 520 that provides a reference voltage (VSS) to the P-well 512.

Certain embodiments are directed toward an SCR circuit that includes an embedded diode(s) formed between the N-doped fingers 514 and the P-doped regions 518 and 512. For instance, the P-doped region 518 can be configured as one or more fingers that are connected to node A through the interconnection/wiring layer of the IC chip. This diode can provide a conduction path between node A and VSS before the bipolar transistors of the SCR are fully enabled. As discussed herein, the use of active guard region 516 can delay the SCR enablement, during which time the embedded diode(s) can shunt ESD current.

The active guard region 516 is shown as being located on a single side of the N-well 510. In various embodiments, the active guard region 516 can surround the N-well 510 to form an active guard ring. Similarly, the regions 514, 518, and 520 can surround the active guard region 516.

Figure 6:
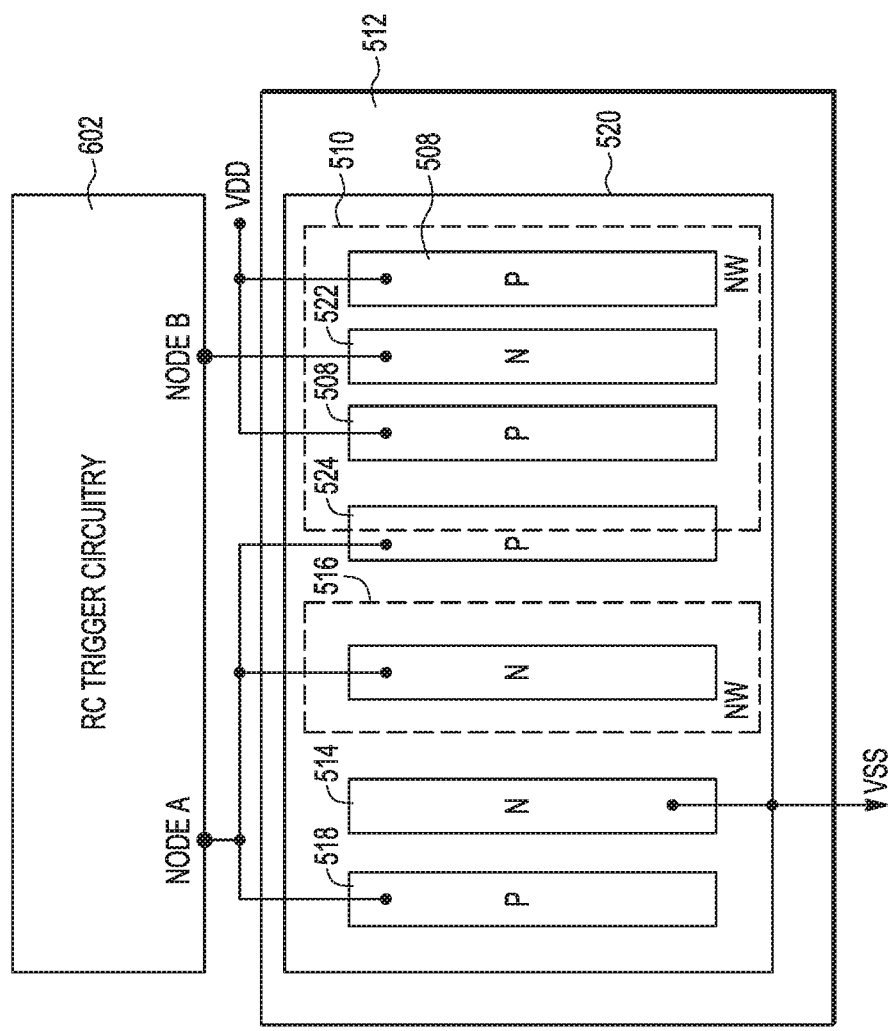
FIG. 6 is a top-down view of an apparatus that includes an SCR circuit for providing ESD protection, consistent with embodiments of the present disclosure.

FIG. 6 is a top down view of an apparatus that includes an SCR circuit for providing ESD protection, consistent with embodiments of the present disclosure. RC trigger circuitry 602 can be located outside of the SCR circuit area and drive node A and B, consistent with one or more of the various embodiments discussed herein. The top-down view generally corresponds to the similarly numbered components from FIG. 5. The corresponding discussion of these components and their respective functions are not repeated for the sake of brevity.

According to certain embodiments, the depict regions can be arranged in concentric shapes, such that each region surrounds the prior region. For instance, the components with the N-well can have a rectangular shape that is surrounded by region 524. Region 524 can be surrounded by AGR region 516 and so forth.

Figure 7:
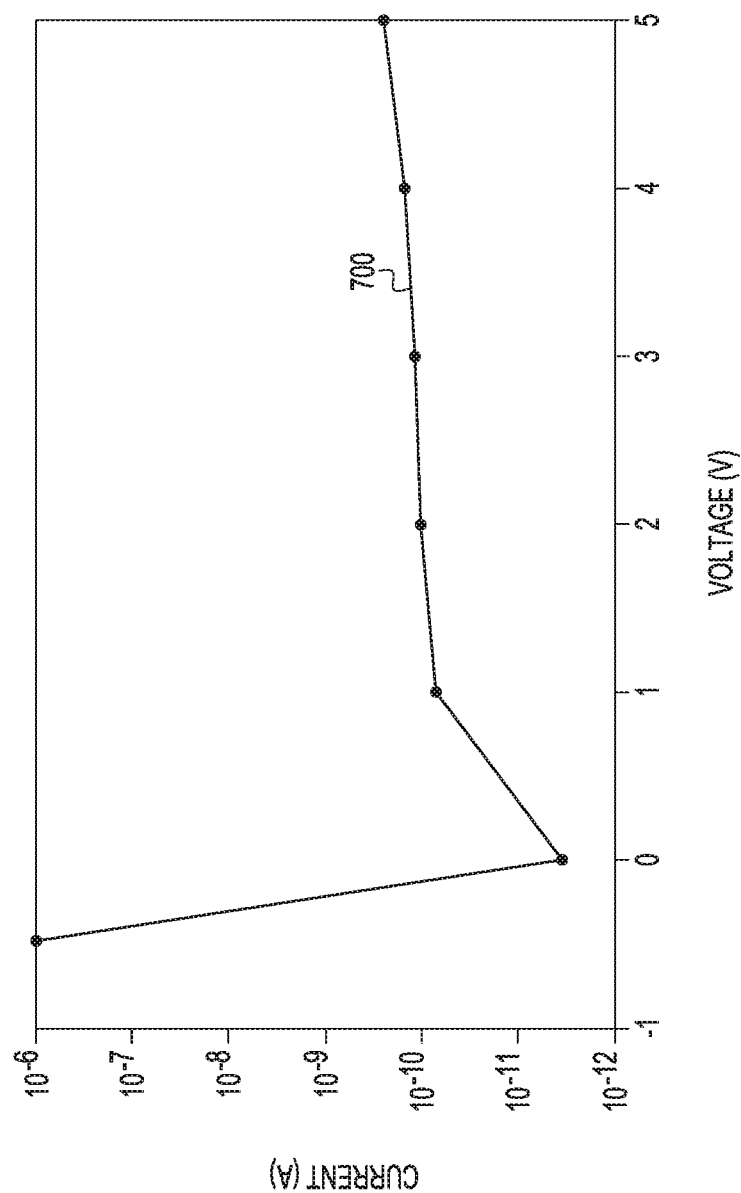
FIG. 7 is a graph for a DC sweep of an ESD protection circuitry with AGR, consistent with embodiments of the present disclosure.

FIG. 7 is a graph for a DC sweep of an ESD protection circuitry with AGR, consistent with embodiments of the present disclosure. The experimental results 700 of FIG. 7 show a DC voltage sweep of ESD protection circuitry that is consistent with the circuit configuration of FIG. 2 and the layout of FIG. 5. This graph shows the current draw of the ESD protection circuitry with different DC voltages applied to the node under protection. The test limited the maximum current to 1 uA for each of the measurements. The DC voltage sweep shows little current is drawn by the ESD protection circuit at 5 V ($\sim 10^{-10}$ A). This demonstrates that the leakage current is sufficiently low up to at least 5V to be used in many applications.

Figure 8:
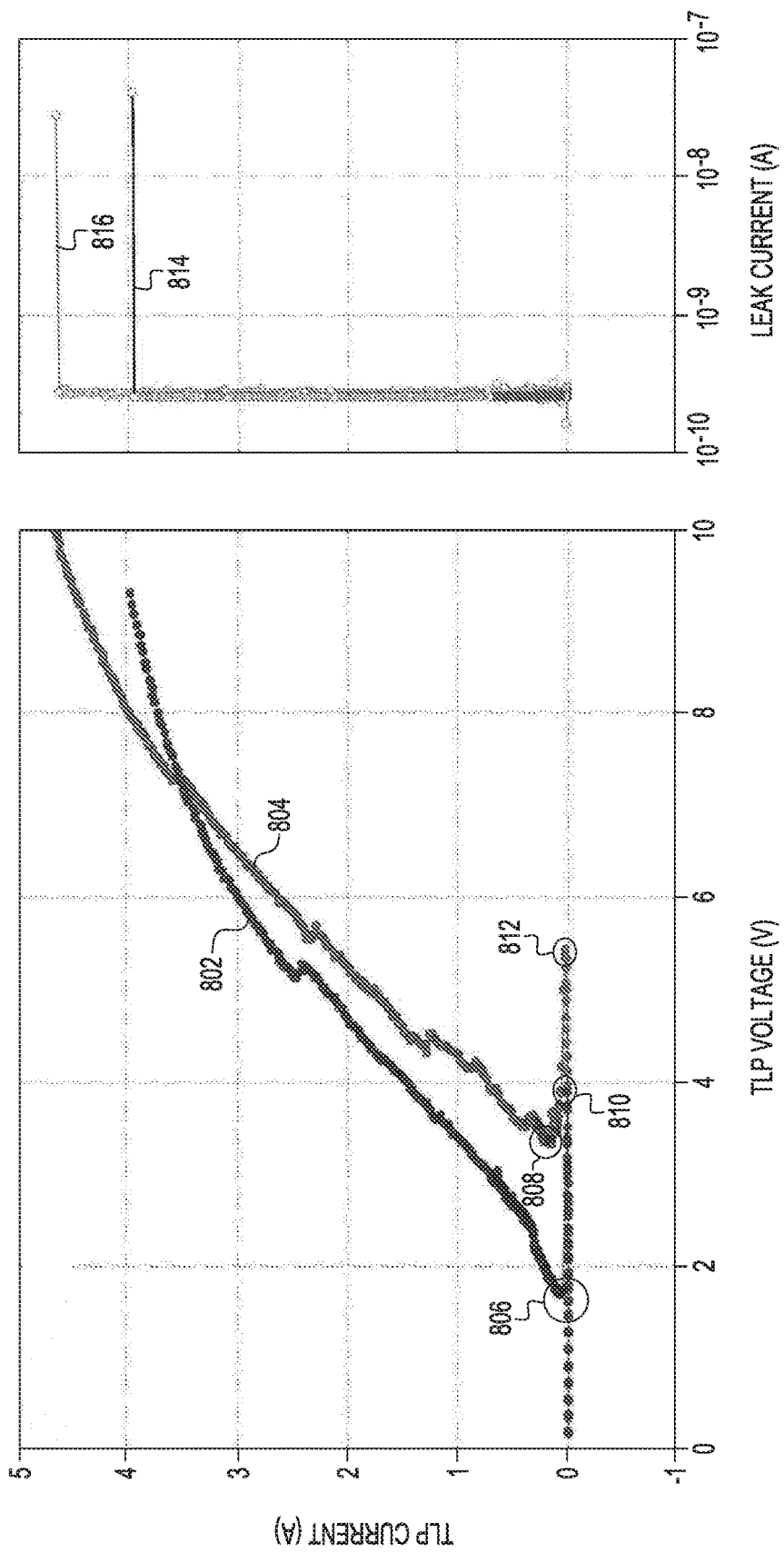
FIG. 8 is a graph of experimental transmission line pulse (TLP) test results, consistent with embodiments of the present disclosure.

FIG. 8 is a graph of experimental transmission line pulse (TLP) test results, consistent with embodiments of the present disclosure. Line 802 shows TLP test results for an RC triggered SCR (RCSCR) without a guard ring. Line 804 shows TLP test results from an RCSCR that includes a guard ring, consistent with various embodiments herein. The trigger voltage (Vt) is higher for the RCSCR with the guard ring, as shown by location 812 being a higher voltage than location 810. Moreover, the snapback holding voltage (Vh) is also higher, as shown by the higher voltage shown by location 808, relative to location 806. In the depicted example, the snapback holding voltage for the RCSRC with the guard ring is above 3 V, relative to the snapback holding voltage of less than 2 V for the RCSCR without the guard ring.

According to embodiments of the present disclosure, an ESD design window can define the acceptable operational parameters for the ESD protection circuit. More particularly, the ESD design window can be set such that the ESD protection circuit is activated (the trigger voltage) at a voltage that is below a voltage at which the device under protection is permanently damaged (the failure voltage of the device). The ESD design window can also be set to avoid latch up conditions by ensuring that the snapback holding voltage of the ESD protection circuit is above the operating voltage of the device being protected. For instance, if the ESD protection circuit might operate in a 3 V voltage domain, the ESD design window can specify a snapback holding voltage that is above 3 V. If the device being protected suffers failure above 7V, then the trigger voltage should be less than 7V. The amount that the snapback holding voltage is above the operating voltage can be increased to provide margin (e.g., to account for slight differences in caused by processing variations). A similar margin can be implemented for the trigger voltage relative to the device failure voltage. Accordingly, the RCSCR without the guard ring is subject to latch-up conditions for voltages exceeding 2 V, due to the lower snapback holding voltage. This generally means that the RSSCR will be unsuitable for applications in which the voltage domain of the protected node exceeds 2V. The RCSCR with the guard ring can operate with a voltage domain at 3V, or slightly higher, without suffering from latch-up problems.

The last point in the respective TLP lines shows the device failure point (It2). As shown, the line 804 has a higher It2 value. The right most graph shows leakage current for the RCSCR with (816) and without (814) a guard ring. This suggest that the on resistance (Ron) was lower for the RCSCR with the guard ring than without.

Figure 9:
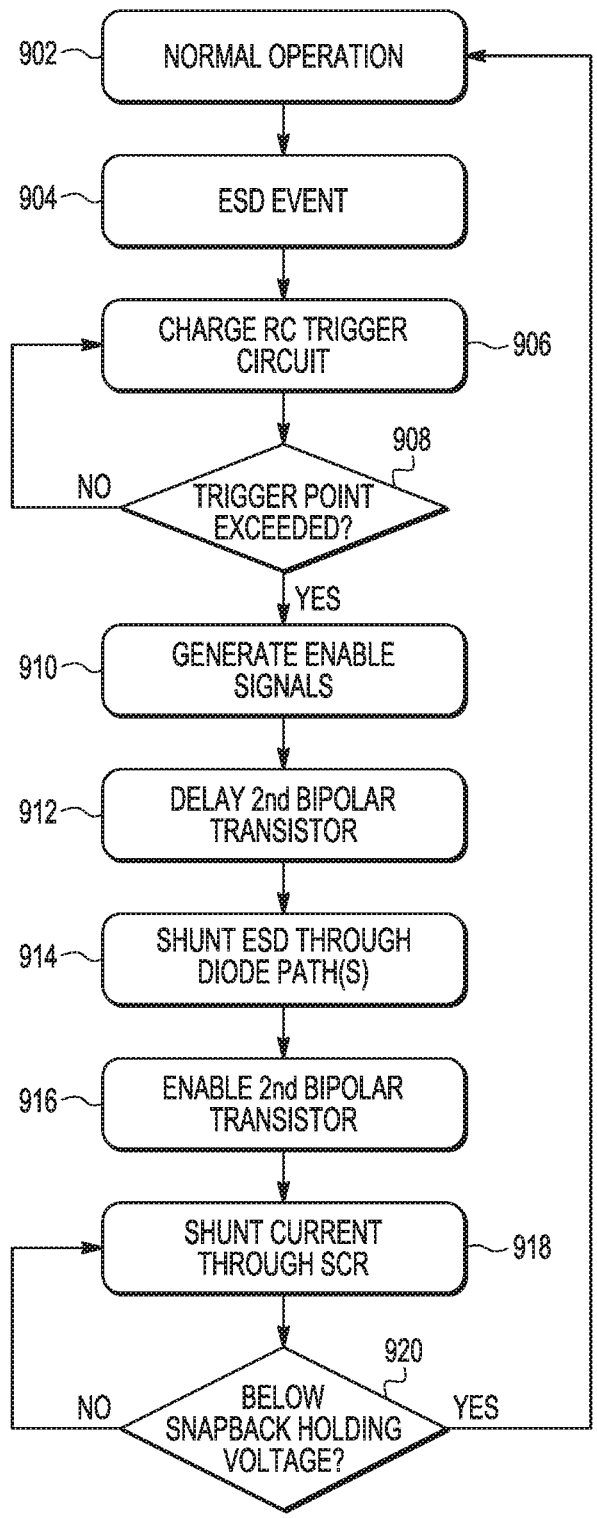
FIG. 9 is a flow diagram for providing ESD protection using an RCSCR circuit with a guard region, consistent with embodiments of the present disclosure.

FIG. 9 is a flow diagram for providing ESD protection using an RCSCR circuit with a guard region, consistent with embodiments of the present disclosure. The RCSCR circuit can be consistent with various embodiments discussed herein. In the absence of an ESD event and corresponding ESD voltage, the RCSRC circuit can operate normally, per block 902. During normal operation the RC SRC circuit is designed to have little effect on the node being protected from ESD events (e.g., by having a low leakage current).

Upon receipt of an ESD event, per block 904, the RC trigger circuit begins to charge, per block 906. Consistent with the discussions herein, the RC portion of the RC trigger circuit is connected to logic circuitry that is configured to drive the SCR circuit in response to a voltage of the RC circuit. The point at which the SCR circuit is driven is referred to as the trigger point, as shown by decision block 908. Once the trigger point has been exceeded the logic circuitry can generate enable signals that drive the bipolar transistors of the SCR circuit, per block 910.

Consistent with various embodiments of the present disclosure, the guard region (or guard ring) can be designed to impeded current flow so as to delay the enabling of the second bipolar transistor, per block 912. During the delay time, ESD current can be shunted through one or more embedded diode paths, per block 914. Examples of these paths are discussed in connection with FIG. 4 and the corresponding embedded diodes. The SCR circuit can then be fully enabled, per block 916, so that shunts ESD current, per block 918. The SCR circuit can continue shunting ESD current until the ESD voltage drops below the snapback holding voltage, per block 920.

Figure 10:
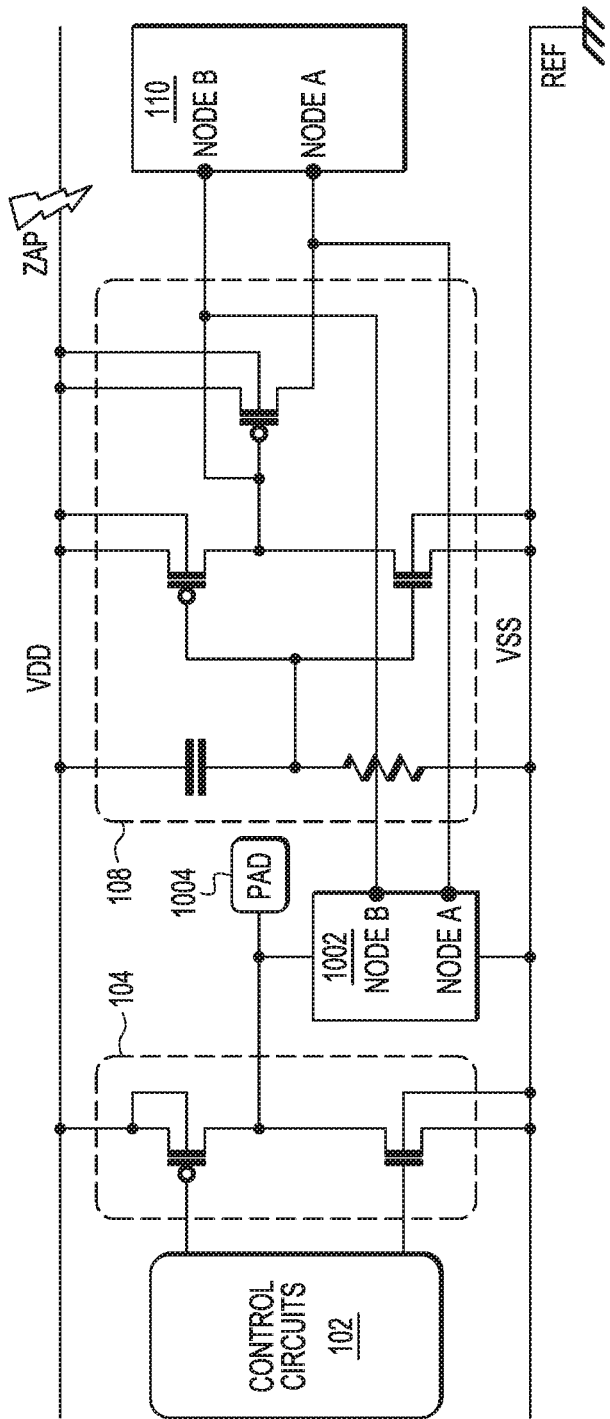
FIG. 10 is a circuit diagram for a system that includes ESD protection circuitry, consistent with embodiments of the present disclosure.

FIG. 10 is a circuit diagram for a system that includes ESD protection circuitry, consistent with embodiments of the present disclosure. The circuit diagram generally corresponds to embodiments that are consistent with the similarly numbered components from FIG. 1. The corresponding discussion of these components and their respective functions are not repeated for the sake of brevity. In addition, FIG. 10 shows that a second ESD protection circuit 1002 can be used to provide ESD protection for an output pad 1004. Output pad 1004 can be driven by a driver circuit 104, which is responsive to one or more control circuits 102. In particular embodiments, the VDD is around 3V, which is consistent with the experimental results shown by FIGS. 7 and 8. It is recognized, however, that the specific design window for the ESD protection circuit can be adjusted by varying parameters of the ESD protection circuit, while still using the guard region and other aspects discussed herein.

The second ESD protection circuit 1002 is also an SCR device, which can include a guard region. The second ESD protection circuit 1002 is shown as share the RC circuitry 108. Under normal operation with VDD and VSS are on, the ESD protection circuits 1002 and 110 both remain inactive. In response to an ESD event (e.g., a positive ESD voltage from PAD to VSS), the ESD current conducts through parasitic forward diode of PMOS in transistor 104. This charges capacitor between the VDD rail and activates the RC circuitry 108 so that it drives node A and node B. As a result, there are two ESD shunting paths activated. The first is through the ESD protection circuit 1002, directly from PAD to VSS. The second is through the parasitic diode of PMOS in 104 and then through ESD protection circuit 110.

The various terminology used in the Specification should be given their ordinary plain meaning in the art unless otherwise indicated. As examples, the Specification describes and/or illustrates aspects useful for implementing the various embodiments by way of circuits or circuitry. In some instances, the configuration of the circuitry can described and illustrated using, for example, blocks, modules, devices, systems, units, controllers, or engines. Such circuits or circuitry can be discussed in relation to how they are used together and with other elements in order to describe certain embodiments relative to their related structures, steps, functions, or operations. For example, in certain of the above-discussed embodiments, one or more modules are discrete logic circuits or programmable logic circuits configured and arranged for implementing these operations/activities, as may be carried out consistent with the approaches shown in the Figs. In certain embodiments, the various modules can be implemented using one or more computer processing circuits and memory circuitry. The memory circuitry can store and access a set (or sets) of instructions (and/or to be used as configuration data to define how the computer processing circuit is to perform), which can be executed in order to implement an algorithm or process as described in the disclosure.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus comprising:
   a silicon controlled rectifier (SCR) circuit configured to shunt electrostatic discharge (ESD) current from a node to a reference voltage, the SCR circuit including:
   a first bipolar PNP transistor having a first emitter connected to the node, a first base, and a first collector;
   a second bipolar NPN transistor having a second collector sharing a first region with the first base, a second base sharing a second region with the first collector, and a second emitter electrically connected to the reference voltage, wherein the first region comprises a first N-well; and
   a guard region arranged between the first emitter and the second emitter, wherein the guard region comprises a second N-well separate and distinct from the first N-well, the guard region is tied to both the first collector and the second base such that the guard region is at a same voltage as the first collector and the second base, and the guard region is configured to delay triggering of the SCR circuit in response to an ESD event by impeding current flow in the second region.

2. The apparatus of claim 1, wherein the first bipolar PNP transistor is configured to shunt ESD current in response to a trigger current generated by an resistor-capacitor (RC) trigger circuit.

3. The apparatus of claim 2, wherein the second base of the second bipolar transistor is configured to receive the ESD current shunted by the first bipolar transistor.

4. The apparatus of claim 3, wherein the second bipolar NPN transistor includes an embedded diode between the second base and second emitter.

5. The apparatus of claim 1, wherein the second region is a P-doped substrate, and the first N-well and the second N-well are formed within the P-doped substrate.

6. The apparatus of claim 1, further comprising a resistor trigger circuit that includes a resistor-capacitor (RC) circuit connected between the node and the reference voltage and logic connected between the RC circuit and the first and second bipolar transistors and configured to enable the SCR in response to the RC circuit.

7. The apparatus of claim 1, wherein the second bipolar NPN transistor includes an embedded diode between the base and emitter and the embedded diode is configured and arranged to conduct a portion of the ESD current and thereby increase secondary breakdown current of the apparatus.

8. The apparatus of claim 1, wherein the SCR circuit is configured to provide a leakage current of less than about $10^{-6}$ Amperes for direct current voltages of 5 V.

9. The apparatus of claim 1, wherein the SCR circuit is configured to provide a snapback holding voltage of at least 3 V.

10. A method for providing electrostatic discharge (ESD) protection using a silicon controlled rectifier (SCR) circuit, the method comprising:
charging, in response to an ESD event, a resistor-capacitor (RC) trigger circuit;
enabling, in response to charge on the RC trigger circuit, a first bipolar transistor in the SCR circuit;
delaying enabling of a second bipolar transistor of the SCR circuit by impeding current through a region corresponding to a collector of the first bipolar transistor, which is shared by a base of the second bipolar transistor, using a guard region that comprises a first N-well, wherein the first N-well is separate and distinct from a second N-well that is shared by a base of the first bipolar transistor and a collector of the second bipolar transistor, and
the guard region is tied to the collector of the first bipolar transistor and the base of the second bipolar transistor such that the guard region is at a same voltage as the collector of the first bipolar transistor and the base of the second bipolar transistor; and
shunting, subsequent to the delaying, ESD current through the first and second bipolar transistors of the SCR circuit.

11. The method of claim 10, wherein the first bipolar transistor is a vertical PNP bipolar transistor and the enabling is responsive to current injected into an N portion of the first bipolar transistor and results in a current in a substrate of the SCR circuit.

12. The method of claim 11, wherein the second bipolar transistor is an NPN bipolar transistor and the substrate serves as the base of the NPN bipolar transistor and a collector of the PNP bipolar transistor.

13. The method of claim 12, wherein the current from the enabled first bipolar transistor to the base of the second bipolar transistor is impeded using the guard region to divert a portion of the current in the substrate through the guard region.

14. The method of claim 10, wherein the current from the enabled first bipolar transistor to the base of the second bipolar transistor is impeded using the guard region by providing a voltage bias to the guard region.

15. The method of claim 10, wherein the enabling of the first bipolar transistor includes using a CMOS inverter circuit between the RC trigger circuit and the first bipolar transistor to drive a base of the first bipolar transistor.

16. The method of claim 10, further comprising providing a leakage current of the SCR circuit of less than about $10^{-6}$ Amperes for direct current voltages between −1 V and 5 V.

17. The method of claim 10, further comprising providing a snapback holding voltage for the SCR circuit of at least 3 V.

18. The apparatus of claim 1, further comprising a P-well located between the first N-well and the second N-well.

19. The method of claim 10, wherein the guard region forms a PN junction with the region corresponding to the collector of the first bipolar transistor.

\* \* \* \* \*